United States Patent
Shimizu et al.

(10) Patent No.: US 6,327,555 B1
(45) Date of Patent: Dec. 4, 2001

(54) SEMICONDUCTOR SIMULATION METHOD

(75) Inventors: Shunkichi Shimizu, Tokyo; Mikio Mukai; Yasutoshi Komatsu, both of Kanagawa, all of (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/300,283

(22) Filed: Apr. 27, 1999

(30) Foreign Application Priority Data

Apr. 28, 1998 (JP) .................................................. 10-117972
Jun. 9, 1998 (JP) .................................................. 10-160843

(51) Int. Cl.[7] .................................................. G06F 17/50
(52) U.S. Cl. .................................. 703/12; 703/2; 702/85; 702/90; 700/110; 700/123
(58) Field of Search ............................ 703/12, 2; 702/85, 702/90, 91; 700/123, 110; 204/192.13

(56) References Cited

U.S. PATENT DOCUMENTS

| | | | |
|---|---|---|---|
| 5,751,607 | * 5/1998 | Ohta | 364/578 |
| 5,859,784 | * 1/1999 | Sawahata | 364/578 |
| 5,886,909 | * 3/1999 | Milor et al. | 364/578 |
| 5,926,402 | * 7/1999 | Tatsuta et al. | 364/578 |
| 5,966,312 | * 10/1999 | Chen | 364/578 |
| 5,983,011 | * 11/1999 | Yamada et al. | 395/500.35 |

* cited by examiner

*Primary Examiner*—Kevin J. Teska
*Assistant Examiner*—Thai Phan
(74) *Attorney, Agent, or Firm*—Ronald P. Kananen; Rader, Fishman & Grauer PLLC

(57) ABSTRACT

Impurity profiles Pi1 and Ps1 are determined for the same conditions by a reference acquiring means and a simulation capable of producing a result faster than the reference acquiring means, respectively. Errors between the impurity profile Pi1 determined by the reference acquiring means and the impurity profile Ps1 determined by the simulation are determined. An impurity profile Psx is calculated for another kind of conditions by the simulation, and a new impurity profile Psx' is calculated by correcting the impurity profile Psx so as to reflect the errors.

20 Claims, 10 Drawing Sheets

MEASUREMENT RESULT

SEMICONDUCTOR SIMULATION METHOD

BACKGROUND OF THE INVENTION

1. Field of the Invention

The present invention relates to a semiconductor simulation method for determining an impurity profile in a substrate or a physical quantity of a prescribed portion of a semiconductor device through calculation.

The invention also relates to a semiconductor device simulation method for predicting an impurity profile inside a semiconductor device or a device characteristic of a semiconductor device and for optimizing a device structure or manufacturing process conditions by process/device simulations.

2. Description of the Related Art

In the semiconductor manufacture, simulations of a concentration profile of an impurity that is implanted in a substrate are widely used. Such a simulation makes it possible to evaluate, before actual manufacturing, the optimized concentration profile and optimized conditions for required specifications, and hence contributes to shortening of a development period and reduction of a manufacturing cost.

In such a simulation, it is ideal to correctly determine impurity profiles for all kinds of process conditions by using a calculation method for determining an impurity profile with high accuracy (e.g., high-accuracy simulators) or by actual measurement. However, this is not realistic because it requires an unduly long time and a high cost.

In view of the above, a method is employed in which impurity profiles for several kinds of process conditions are determined in advance by using a means for determining an impurity profile with high accuracy, and interpolation is performed for another kind of process conditions based on thus-determined impurity profiles.

However, even in the method of performing such interpolation, it is necessary to determine impurity profiles for several kinds of process conditions by using a highly accurate calculation method. To improve the interpolation accuracy, it is necessary to perform calculations for as many kinds of process conditions as possible.

It is conceivable to determine impurity profiles for several kinds of process conditions by using a highly accurate calculation method and change some process condition items to conditions different from actual ones so that results of a process simulation satisfy those impurity profiles. However, it is not easy to determine condition items and values to be changed and much experience and time are needed to make such a determination.

In development of semiconductor devices such as an MOS transistor, the prediction of device characteristics of the semiconductor device by process/device simulations and the simulation of the semiconductor device to optimize the device structure or the manufacturing process conditions are key factors. The process/device simulation is generally classified into: (1) a process simulation for determining the topographies of a semiconductor device or an impurity profile (or concentration profile) inside a semiconductor device for the input of semiconductor device manufacturing conditions and so forth; and (2) a device simulation for determining electrical characteristics of a semiconductor device for the input of an impurity profile inside the semiconductor device and topographies and voltage conditions of the semiconductor device.

As for the device simulation, a correct two-dimensional impurity profile inside a semiconductor device for its manufacturing process conditions and topographies or structures is needed. Example methods for determining a two-dimensional impurity profile are a post-measurement data conversion method, a complex angle lap method, and a staining method. In recent years, an inverse modeling method has been proposed that determines an impurity profile inside a semiconductor device from device electrical or characteristics of the semiconductor device.

However, the performance of each of the post-measurement data conversion method, the complex angle lap method, and the staining method is still insufficient for practical use in terms of determination of a correct two-dimensional impurity profile inside a semiconductor device.

The inverse modeling method is mainly used for determining an impurity profile inside a semiconductor device for its particular topographies or structure and device characteristics (i.e., its electrical characteristics), and its application range is limited to such cases as changing the gate length or the gate oxide film thickness. For example, the inverse modeling method has difficulty in deriving a consistent impurity profile for devices having different channel lengths and cannot change such manufacturing process conditions as conditions of a heat treatment for impurity diffusion after execution of an impurity implantation step in predicting a device characteristic by a device simulation by using a determined impurity profile. That is, the application range is quite limited.

SUMMARY OF THE INVENTION

The present invention has been made in view of the above problems in the art, and an object of the invention is therefore to realize an efficient simulation method that provides a desired simulation result without decreasing the calculation accuracy.

Another object of the invention is to provide a semiconductor device simulation method having a wide application range that makes it possible to derive a consistent impurity profile for devices having different channel lengths as well as to change such manufacturing process conditions as conditions of a heat treatment for impurity diffusion after execution of an impurity implantation step in predicting a device characteristic by a device simulation by using a determined impurity profile.

According to a first aspect of the invention, there is provided a semiconductor simulation method comprising the steps of determining first and second impurity profiles for the same conditions by a reference acquiring means and a calculating means capable of producing a result faster than the reference acquiring means, respectively; determining errors between the first impurity profile determined by the reference acquiring means and the second impurity profile determined by the calculating means; and calculating a third impurity profile for another kind of conditions by the calculating means, and calculating a fourth impurity profile by correcting the third impurity profile so as to reflect the errors.

There is also provided a semiconductor simulation method comprising the steps of determining first and second values of a physical quantity of a prescribed portion for the same conditions by a reference acquiring means and a calculating means capable of producing a result faster than the reference acquiring means, respectively; determining an error between the first value determined by the reference acquiring means and the second value determined by the calculating means; and calculating a third value of the physical quantity of the prescribed portion for another kind of conditions by the calculating means, and calculating a fourth value of the physical quantity of the prescribed portion by correcting the third value so as to reflect the error.

In the above semiconductor simulation methods according to the first aspect of the invention, errors between impurity profiles (or values of a physical quantity of a prescribed portion) calculated for the same conditions by the reference acquiring means and the calculating means is determined, and an impurity profile (or a value of the physical quantity of the prescribed portion) calculated for another kind of conditions by using the calculating means are corrected so as to reflect the errors. Therefore, an impurity profile (or a value of the physical quantity of the prescribed portion) can be calculated with accuracy that is equivalent to the accuracy as would be obtained by the reference acquiring means, by using the calculating means capable of producing a result faster than the reference acquiring means. This makes it possible to perform a highly accurate simulation in a short time at a low cost.

According to a second aspect of the invention, there is provided semiconductor device simulation method comprising the steps of setting initial process conditions; deriving an initial impurity profile based on initial process conditions; setting an initial device characteristic corresponding to the initial process conditions; deriving a modified impurity profile that satisfies the initial device characteristic by performing impurity profile modification starting from the initial impurity profile; deriving a difference impurity profile by calculating differences between the modified impurity profile and the initial impurity profile; setting desired process conditions; deriving an impurity profile by a process simulation based on the desired process conditions; and correcting the impurity profile by adding the difference impurity profile to the impurity profile.

In the above semiconductor device simulation method, a difference impurity profile between an initial impurity profile derived based on particular initial process conditions and a modified impurity profile obtained by performing impurity profile modification starting from the initial impurity profile so that an initial device characteristic corresponding to the initial process conditions is satisfied is derived.

Thereafter, desired process conditions are set, and an impurity profile is derived by a process simulation based on the desired process conditions and then corrected by adding the difference impurity profile to it. This method makes it possible to easily eliminate incorrectness in an impurity profile derived by a process simulation by adding a difference impurity profile to it. As a result, a semiconductor simulation method can be realized that has a wide application range as exemplified by an ability of deriving a unified impurity profile for devices having different channel lengths.

The above semiconductor device simulation method may further comprise the step of deriving a device characteristic by a device simulation based on the difference-impurity-profile-added impurity profile. That is, incorrectness in an impurity profile derived by a process simulation can easily be eliminated by adding a difference impurity profile to it, and a device characteristic is derived by a device simulation based on a resulting impurity profile. As a result, a semiconductor device simulation method can be realized that has a wide application range as exemplified by an ability of changing such manufacturing process conditions as a dose and energy of impurity ion implantation and conditions of a heat treatment for impurity diffusion after execution of an impurity implantation step and then easily deriving a device characteristic corresponding to resulting manufacturing process conditions.

According to the second aspect of the invention, there is also provided a semiconductor device simulation method comprising the steps of setting initial process conditions; deriving an initial impurity profile based on the initial process conditions; setting an initial device characteristic corresponding to the initial process conditions; deriving a modified impurity profile that satisfies the initial device characteristic by performing impurity profile modification starting from the initial impurity profile; deriving correction values for the initial process conditions by deriving process conditions that satisfy the modified impurity profile by a process simulation in which items of the initial process conditions are used as variables; setting desired process conditions; correcting the desired process conditions by using the correction values for the initial process conditions; and deriving an impurity profile by the process simulation based on the corrected desired process conditions.

In the above semiconductor device simulation method, a modified impurity profile that satisfies an initial device characteristic corresponding to particular initial process conditions is derived by performing impurity profile modification starting from an initial impurity profile derived from the initial process conditions. Correction values for the initial process conditions are derived by deriving process conditions that satisfy the modified impurity profile by a process simulation. Thereafter, desired process conditions are set and corrected by using the correction values for the initial process conditions, and then an impurity profile is derived by a process simulation. By correcting process conditions, this method makes it possible to easily eliminate incorrectness in an impurity profile derived by a process simulation. As a result, a semiconductor simulation method can be realized that has a wide application range as exemplified by an ability of deriving a unified impurity profile for devices having different channel lengths.

The above semiconductor device simulation method may further comprise the step of deriving a device characteristic by a device simulation based on the impurity profile derived based on the corrected process conditions. That is, incorrectness in an impurity profile derived by a process simulation can easily be eliminated by correcting process conditions in the above manner, and a device characteristic is derived by a device simulation based on a resulting impurity profile. As a result, a semiconductor device simulation method can be realized that has a wide application range as exemplified by an ability of changing such manufacturing process conditions as a dose and energy of impurity ion implantation and conditions of a heat treatment for impurity diffusion after execution of an impurity implantation step and then easily deriving a device characteristic corresponding to resulting manufacturing process conditions.

In the above semiconductor device simulation methods according to the second aspect, the initial impurity profile can be derived based the initial process conditions by the process simulation or by using an analytic function or measurement values.

Further, the initial device characteristic corresponding to the initial process conditions can be set by using actual measurement values, values determined analytically, target values, or a device characteristic obtained by a simulation.

DETAILED DESCRIPTION OF THE PREFERRED EMBODIMENTS

Figure 1:
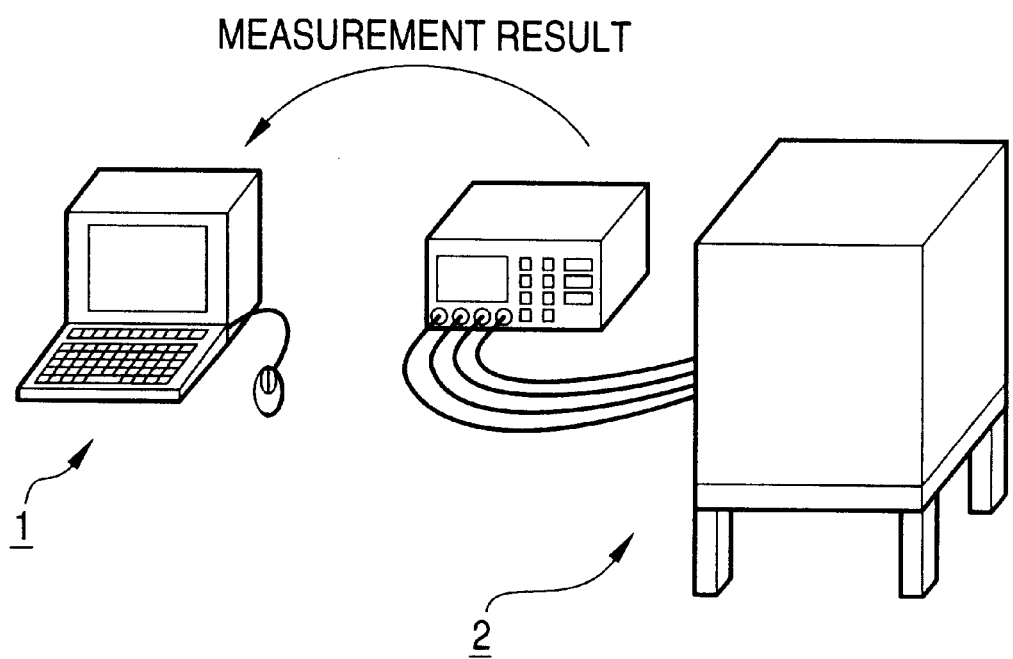
FIG. 1 shows the configuration of a system for executing a semiconductor simulation method according to a first aspect of the present invention.

A semiconductor simulation method according to a first aspect of the invention will be described below with reference to FIG. 1, which shows the configuration of a system for execution of the semiconductor simulation method. The semiconductor simulation method is mainly executed by a computing apparatus 1 such as a computer (e.g., a workstation). In performing a semiconductor simulation, the computing apparatus 1 acquires measurement data (measurement result) of a measuring instrument 2 and performs fitting of a simulation parameter and other operations.

In particular, in the first aspect of the invention, an impurity profile is determined for certain conditions by using a means for determining a reference (reference acquiring means) and an impurity profile is also determined for the same conditions by using a simulation that is less accurate but faster and simpler than in the case of using the reference acquiring means. Any errors between the two impurity profiles are determined in advance. An impurity profile calculated by the fast, simple simulation for another kind of conditions is corrected so as to reflect those errors. In this manner, an impurity profile can be obtained with accuracy that is equivalent to the accuracy of a result that would be obtained with the reference acquiring means.

Specifically, it can be assumed that errors between a highly accurate impurity profile determined for certain conditions by the reference acquiring means and an impurity profile determined by the fast simulation can be approximated by a relatively simple function. Based on this assumption, a function that approximates errors is determined from highly accurate impurity profiles and fast-simulation-determined impurity profiles obtained for several kinds of conditions and an impurity profile calculated by the fast simulation for another kind of conditions is corrected by using the thus-determined function, whereby a more accurate impurity profile is obtained.

Examples of the reference acquiring means, that is, the means for determining a highly accurate impurity profile are actual measurement, inverse modeling, and a high-accuracy simulator.

Embodiment 1

Figure 2:
FIG. 2 shows the concept of a semiconductor simulation method according to a first embodiment of the invention.

A semiconductor simulation method according to a first embodiment of the invention will be described below. FIG. 2 shows the concept of the semiconductor simulation method according to the first embodiment. As shown in FIG. 2, first, a simulation result Ps1 is determined for process conditions (and an ideal impurity profile Pi1 is determined for the same process conditions (, and errors between Ps1 and Pi1 are extracted.

Thereafter, a simulation result Psx is determined for process conditions (and then corrected by the above-extracted errors, whereby an impurity profile Psx' closer to the ideal one is obtained.

Figure 3:
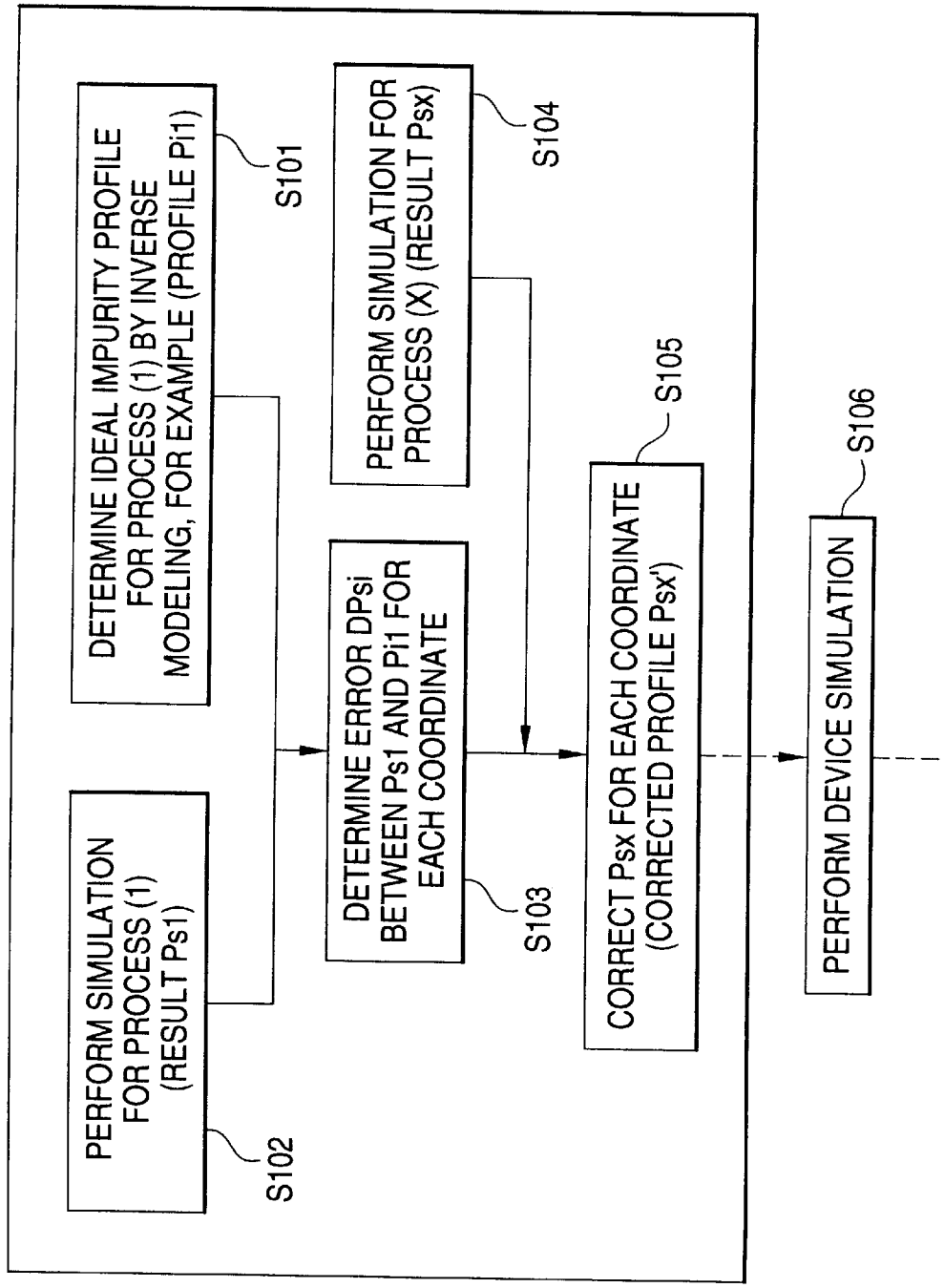
FIG. 3 shows a flow of the semiconductor simulation method according to the first embodiment.

FIG. 3 shows a flow of the semiconductor simulation method according to the first embodiment. First, at step S101, an ideal profile Pi1 for process (1) is determined by using inverse modeling, for example.

At step S102, an impurity profile Ps1 for the same process (1) is determined by a simulation.

At step S103, an error DPsi between the impurity profiles Ps1 and Pi1 determined at steps S101 and S102 is determined for each coordinate point (the coordinates include depth, and the same inclusion applies to this term as used below).

At step S104, an impurity profile Psx for process (X) is determined by a simulation. Although the impurity profile Psx is lower in accuracy than the ideal one, this simulation can calculate a result at a higher speed.

At step S105, the impurity profile Psx for process (X) obtained by the simulation is corrected for each coordinate point by using the above-calculated errors DPsi, whereby a corrected impurity profile Psx' is determined. In this embodiment, the correction is made according to Equation (1).

$$Psx'=Psx+DPsi \tag{1}$$

By making the correction according to Equation (1) for each coordinate point, a highly accurate impurity profile that reflects errors from the ideal one can be obtained even by using the high-speed simulation.

After the impurity profile Psx' has been obtained, a device simulation is performed by using the impurity profile Psx' at step S106.

In the first embodiment, as seen from Equation (1), the errors DPsi between the two impurity profiles, Ps1 and Pi1, are added to the impurity profile Psx for correction. Where the errors DPsi are represented by a multiplication factor (1, the correction is made according to Equation (1').

$$Psx'=(1(DPsi \tag{1'}$$

Embodiment 2

Figure 4:
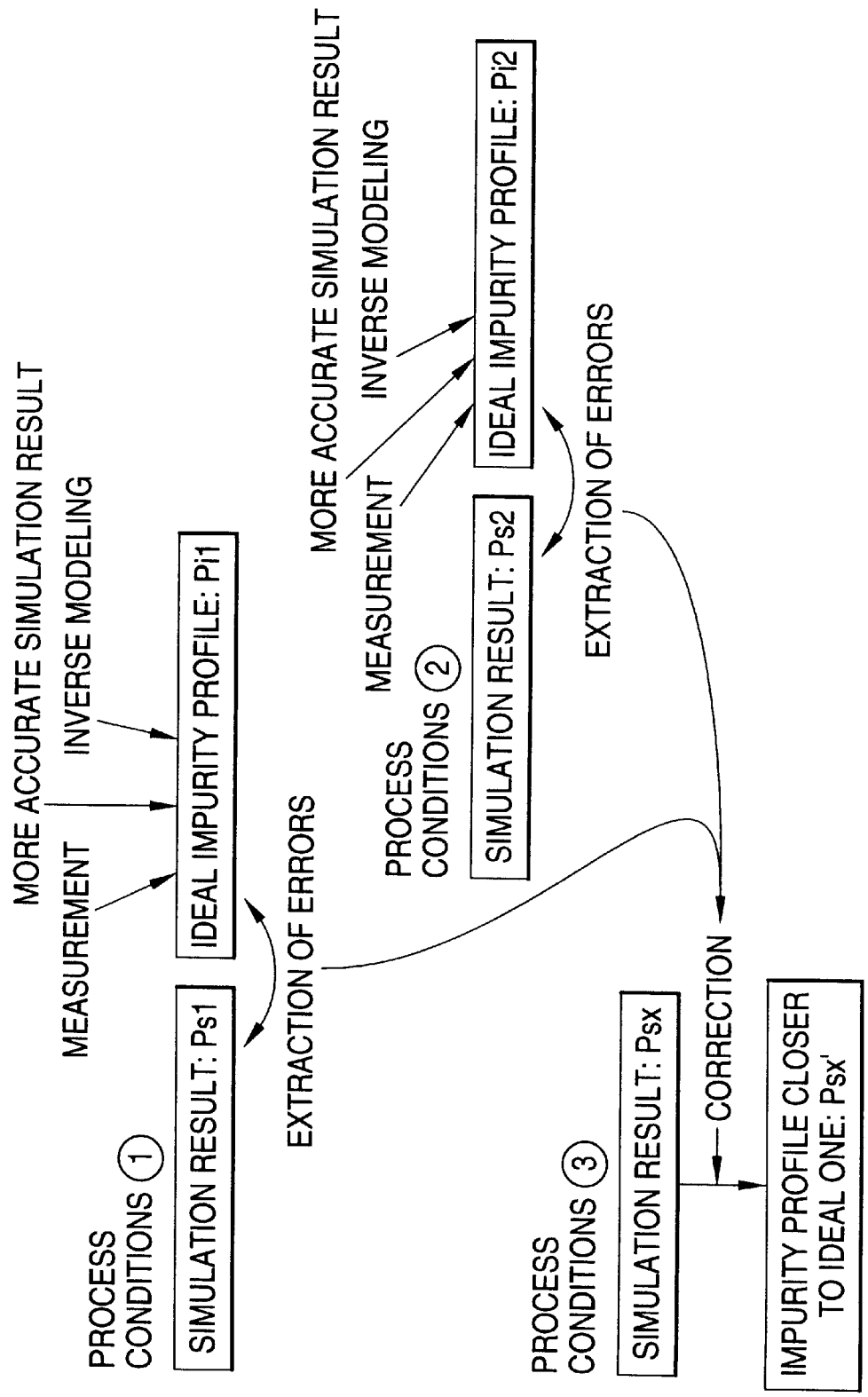
FIG. 4 shows the concept of a semiconductor simulation method according to a second embodiment of the invention.

Next, a semiconductor simulation method according to a second embodiment of the invention will be described. FIG. 4 shows the concept of the semiconductor simulation method according to the second embodiment. As shown in FIG. 4, first, a simulation result Ps1 is determined for process conditions (and an ideal impurity profile Pi1 is determined for the same process conditions (, and errors between Ps1 and Pi1 are extracted.

Then, a simulation result Ps2 is determined for process conditions (and an ideal impurity profile Pi2 is determined for the same process conditions (, and errors between Ps2 and Pi2 are extracted.

Thereafter, a simulation result Psx is determined for process conditions (and then corrected by the above-extracted two kinds of errors, whereby an impurity profile Psx' closer to the ideal one is obtained.

Figure 5:
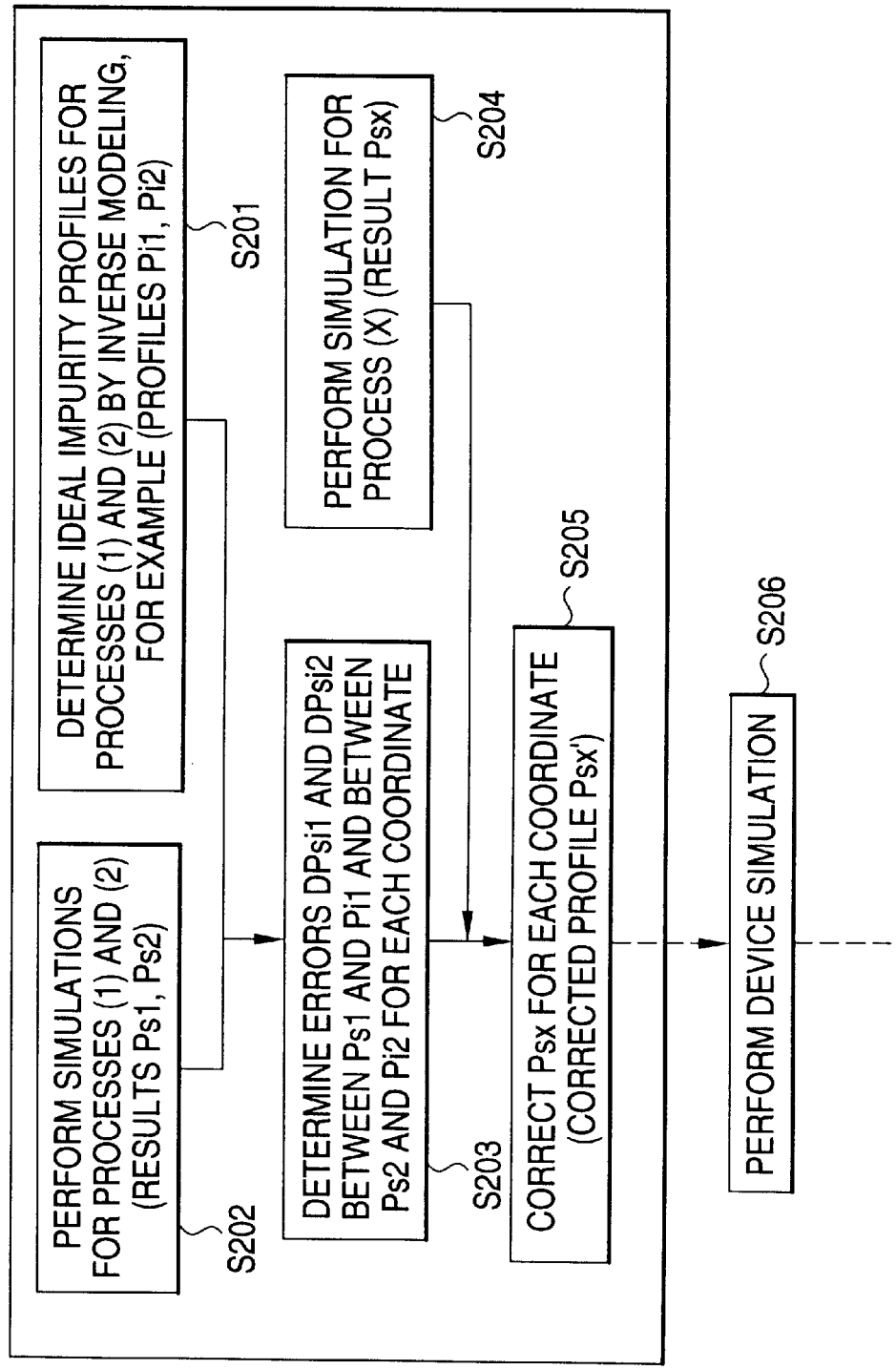
FIG. 5 shows a flow of the semiconductor simulation method according to the second embodiment.

FIG. 5 shows a flow of the semiconductor simulation method according to the second embodiment. First, at step S201, ideal profiles Pi1 and Pi2 for processes (1) and (2) are determined by using inverse modeling, for example.

At step S202, impurity profiles Ps1 and Ps2 for the same processes (1) and (2) are determined by a simulation.

At step S203, an error DPsi1 between the impurity profiles Ps1 and Pi1 determined at steps S201 and S202 and an error DPsi2 between the impurity profiles Ps2 and Pi2 determined at steps S201 and S202 are determined for each coordinate point.

At step S204, an impurity profile Psx for process (X) is determined by a simulation. Although the impurity profile Psx is lower in accuracy than the ideal one, this simulation can calculate a result at a higher speed.

At step S205, the impurity profile Psx for process (X) obtained by the simulation is corrected for each coordinate point by using the above-calculated errors DPsi1 and DPsi2, whereby a corrected impurity profile Psx' is determined. In this embodiment, the correction is made according to Equation (2).

$$Psx'=Psx+DPsix \qquad (2)$$

$$DPsix=\{DPsi1\ ((Ax-A1)+DPsi2\ ((A2-A1)\}/(A2-A1)\}$$

It is assumed that the kinds of conditions of processes (1), (2), and (X) are different from each other in only one parameter of one step. A1, A2, and Ax represent values of that parameter.

That is, in Equation (2), the error DPsix corresponding to the parameter value Ax is determined through proportional distribution by using the errors DPsi1 and DPsi2 corresponding to the parameter values A1 and A2, and the correction is made by adding the error DPsix to the impurity profile Psx obtained by the simulation.

As a result, a highly accurate impurity profile that reflects errors with respect to the ideal one by an amount corresponding to the process conditions can be obtained even by using the high-speed simulation.

After the impurity profile Psx' has been obtained, a device simulation is performed by using the impurity profile Psx' at step S206.

Embodiment 3

Figure 6:
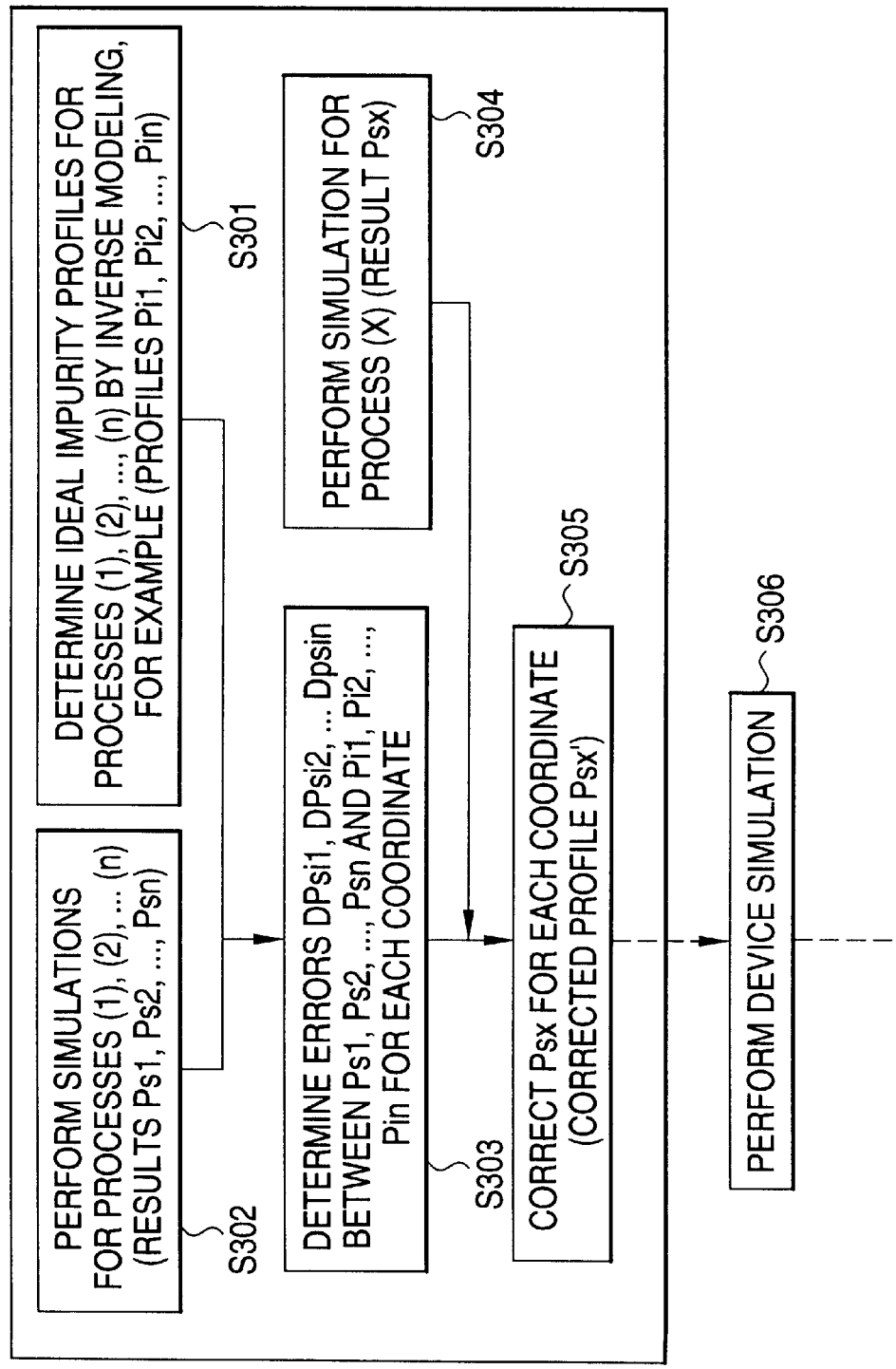
FIG. 6 shows a flow of a semiconductor simulation method according to a third embodiment of the invention.

Next, a semiconductor simulation method according to a third embodiment of the invention will be described. FIG. 6 shows a flow of the semiconductor simulation method according to the third embodiment. In the third embodiment, highly accurate impurity profiles are determined for n kinds of process conditions and impurity profiles are determined by a simulation for the same n kinds of process conditions, and errors between those impurity profiles are determined. An impurity profile determined for another kind of process conditions by a simulation is corrected so as to reflect the thus-determined errors.

First, at step S301, ideal profiles Pi1, Pi2, . . . , Pin for processes (1), (2), . . . , (n) are determined by using inverse modeling, for example.

At step S302, impurity profiles Ps1, Ps2, . . . , Psn for the same processes (1), (2), (n) are determined by a simulation.

At step S303, an error DPsi1 between the impurity profiles Ps1 and Pi1 determined at steps S301 and S302, an error DPsi2 between the impurity profiles Ps2 and Pi2 determined at steps S301 and S302, . . . , an error DPsin between the impurity profiles Psn and Pin determined at steps S301 and S302 are determined for each coordinate point.

At step S304, an impurity profile Psx for process (X) is determined by a simulation. Although the impurity profile Psx is lower in accuracy than the ideal one, this simulation can calculate a result at a higher speed.

At step S305, the impurity profile Psx for process (X) obtained by the simulation is corrected for each coordinate point by using the above-calculated errors DPsi1, DPsi2, DPsin, whereby a corrected impurity profile Psx' is determined. In this embodiment, the correction is made according to Equation (3).

$$Psx'=f(Psx,Ps1, Ps2, \ldots ,Psn, DPsi1,DPsi2, \ldots ,DPsin, V1, V2, \ldots , Vm) \qquad (3)$$

It is assumed that the kinds of conditions of processes (1), (2), . . . , (n) and (X) are different from each other in only one parameter of one step. Symbols V1, V2, . . . , vm in Equation (3) represent prescribed physical quantities.

That is, in Equation (3), the impurity profile Psx' is determined by converting the impurity profile Psx by using the function f that depends on the impurity profile Psx determined for the process conditions (X) by the simulation, the impurity profiles Ps1, Ps2, . . . , Psn determined for the process conditions (1), (2), . . . , (n) by the simulation, the errors DPsi1, DPsi2, . . . , DPsin, and the prescribed physical quantities V1, v2, . . . , Vm.

After the impurity profile Psx' has been obtained, a device simulation is performed by using the impurity profile Psx' at step S306.

In the third embodiment, in a case where the errors DPsi1, DPsi2, . . . , DPsin are represented by multiplication factors (1, (2, . . . , (n, respectively, the correction is made according to Equation (3').

$$Psx'=f(Psx, Ps1, Ps2, \ldots , Psn, (1, (2, \ldots , (n, V1, V2, \ldots , Vm) \qquad (3')$$

Embodiment 4

Figure 7:
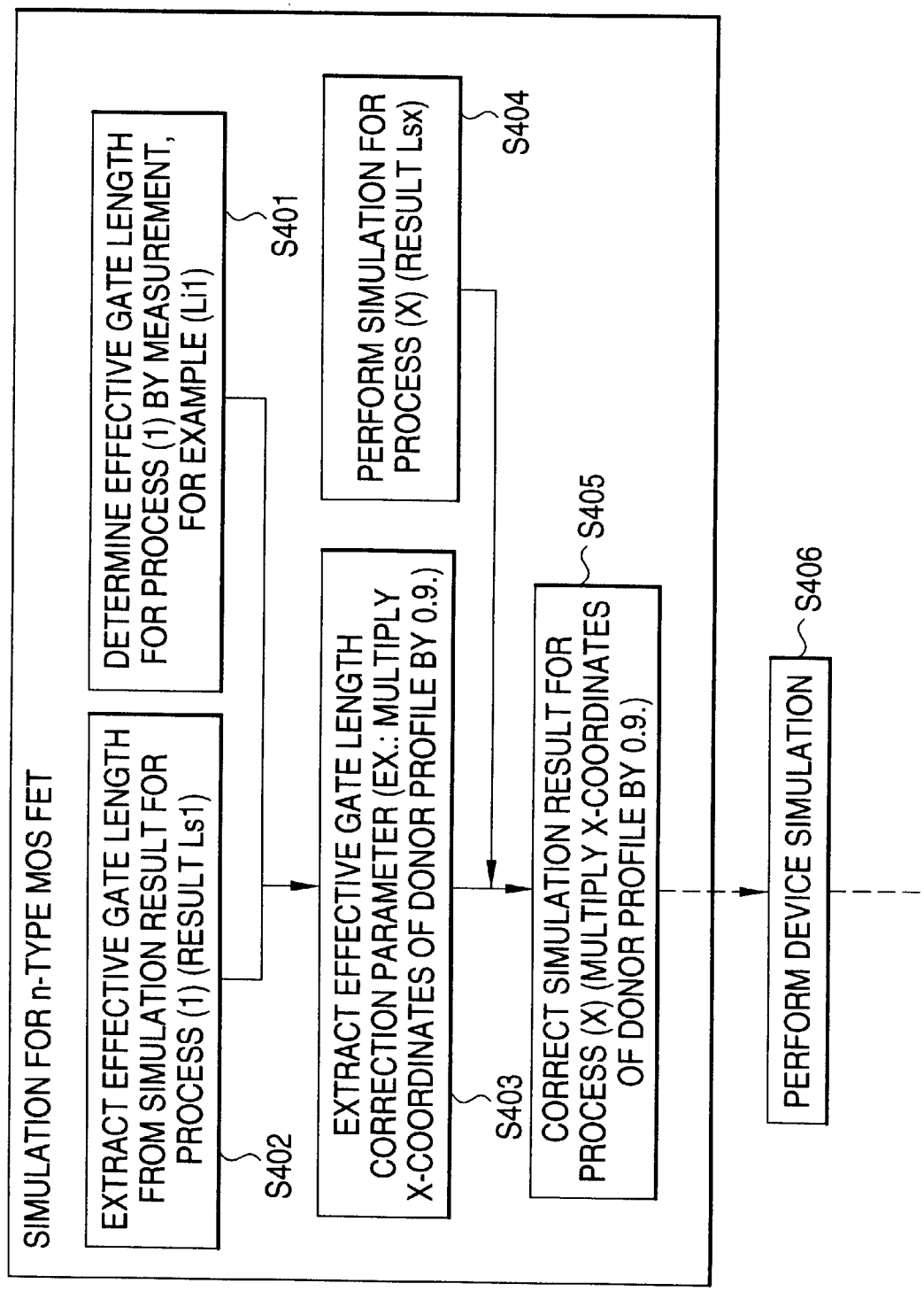
FIG. 7 shows a flow of a semiconductor simulation method according to a fourth embodiment of the invention.
Figure 8:
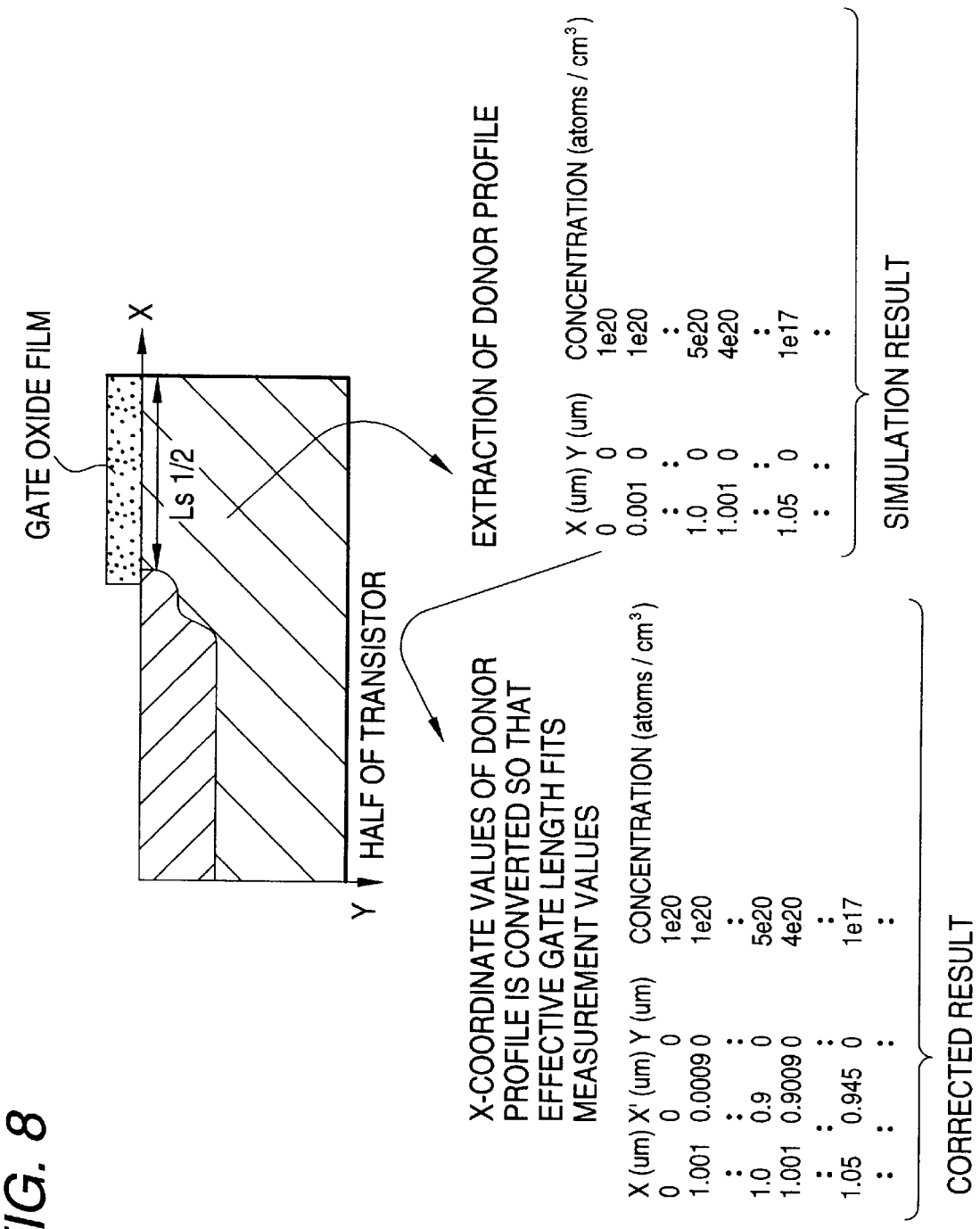
FIG. 8 illustrates the semiconductor simulation method according to the fourth embodiment of the invention.

Next, a semiconductor simulation method according to a fourth embodiment of the invention will be described. FIG. 7 shows a flow of the semiconductor simulation method according to the fourth embodiment, and FIG. 8 includes a schematic sectional view showing the semiconductor simulation method according to the fourth embodiment. The fourth embodiment is mainly directed to a case of determining the effective gate length of a MOS transistor. FIG. 8 shows only a half portion of a MOS transistor.

In the fourth embodiment, first, an effective gate length Li1 is determined with high accuracy for certain process conditions and an effective gate length Ls1 is determined for the same process conditions by a simulation, and an error (1 between the two effective gate lengths Li1 and Ls1 is determined. In this case, the error (1 is a multiplication factor.

An effective gate length Lsx determined for another kind of process conditions by a simulation is corrected by multiplying it by the above-determined error (1.

A specific procedure will be described below with reference to FIG. 7. First, at step S401, a highly accurate effective gate length Li1 for process (1) is determined by using a measurement, for example.

At step S402, an effective gate length Ls1 for the same process (1) is determined by a simulation.

At step S403, an error (correction parameter) (1 between the effective gate lengths Ls1 and Li1 determined at steps S401 and S402 is determined. In this example, (1=0.9.

At step S404, an effective gate length Lsx for process (X) is determined by a simulation. Although the effective gate length Lsx is lower in accuracy than a gate length as would be determined by an actual measurement, this simulation can calculate a result at a much higher speed.

At step S405, the effective gate length Lsx for process (X) obtained by the simulation is corrected by using the above-calculated error (1, whereby a corrected effective gate length Lsx' is determined. That is, the corrected effective gate length Lsx' is given by Equation (4).

$$Lsx'=(1(Lsx \quad (4)$$

By making the correction according to Equation (4), a highly accurate effective gate length can be obtained even by using the high-speed simulation.

After the effective gate length Lsx' has been obtained, a device simulation is performed by using the effective gate length Lsx' at step S406.

Figure 9:
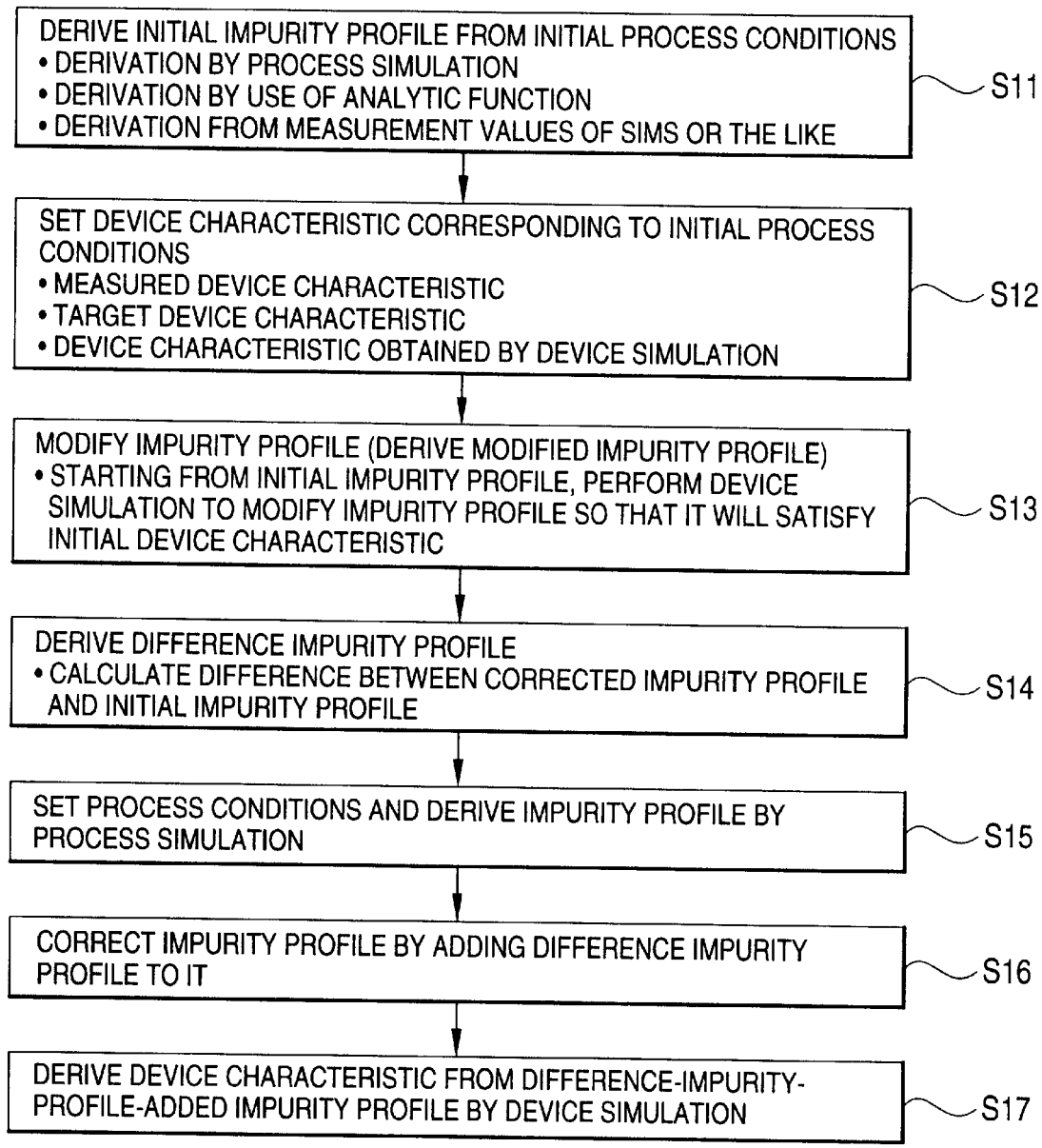
FIG. 9 shows an algorithm of a semiconductor device simulation method according to a fifth embodiment of the invention.

In a simulation result shown in FIG. 9, a donor profile (concentration profile) of a MOS transistor has been determined by a simulation and an effective gate length has been determined from values X at Y=0 (substrate surface).

The thus obtained simulation result is corrected by the error (1 that has been determined in advance. In this example, since (1 is equal to 0.9, each value X in the simulation result shown in FIG. 8 is multiplied by (1=0.9 and a corrected value X' is thereby obtained. In this manner, a highly accurate effective gate length reflecting an error with respect to an effective gate length as would be determined by an actual measurement, for example, can be obtained even by using the high-speed simulation.

Although in the fourth embodiment the simulation values are caused to reflect the error (1 that has been determined for one kind of process conditions, according to the same concept simulation values may be caused to reflect errors (1 and (2 or (1, (2, . . . , (n that have been determined for two or more kinds of process conditions in manners as described in the second and third embodiments.

Although the fourth embodiment is directed to the case of determining an effective gate length of a MOS transistor, the concept of the fourth embodiment can also be applied to a case of some other length (e.g., a gate overlap length) or a prescribed physical quantity.

Further, although the first to third embodiments are directed to the case of determining an impurity profile by a simulation, the concepts of those embodiments can also be applied to a case of determining a concentration profile of an individual impurity such as a donor concentration profile or an acceptor concentration profile.

A semiconductor device simulation method according to a second aspect of the invention will be hereinafter described.

Embodiment 5

FIG. 9 shows an algorithm of a semiconductor device simulation method according to a fifth embodiment of the invention. First, at step S11, process steps and initial process conditions such as mask conditions that are prescribed and a device structure are set, and an initial device structure and an initial impurity profile are derived from the initial process conditions by using, for example, one-dimensional, two-dimensional, or three-dimensional shapes and an impurity simulator or process simulator. Alternatively, an initial device structure and an initial impurity profile may be derived in a simplified manner by using an analytic function or the like or may be derived by using actual measurement values as a result of an experiment according to a secondary ion spectroscopy (SIMS) method or a spreading resistance (SR) method.

At step S12, an initial device characteristic corresponding to the initial process conditions is set. An initial device characteristic may be set in the form of actual measurement values. For example, the initial device characteristic may be Ig–Vd characteristics or Id–Vd characteristics (Vg=0.1V, 2V) each of which are current-voltage characteristics with the gate length L being 0.18, 0.25, 0.35, 0.5, 0.75, 1.0, 2.0, 5.0, and 10.0 (m, a Vth–L characteristic that is gate length dependence of the gate threshold voltage, or a C–V characteristic that is gate voltage dependence on the gate capacitance.

An initial device characteristic may be set in other forms than actual measurement values, for example, analytically determined values, target values that are a desired device characteristic of the semiconductor device determined by some other, arbitrary means, or a device characteristic obtained by a circuit simulation or a one-dimensional, two-dimensional, or three-dimensional device simulation. Where an initial device characteristic is derived by using a device simulation, a device simulation that is different from one that will be used at step S13 and S17 is used.

Then, at step S13, starting from the initial impurity profile, a modified impurity profile is derived by performing impurity profile modification (iterative calculations) by using one-dimensional, two-dimensional, or three-dimensional device simulation or some other algorithm so that the initial device characteristic will be satisfied.

At step S14, a difference impurity profile is derived by calculating differences between the above-determined modified impurity profile and the initial impurity profile for each of minute divisional calculation regions (i.e. mesh regions) of the subject semiconductor device.

At step S15, desired process conditions are set and an impurity profile is derived for the desired process conditions by a process simulation. At step S16, the impurity profile obtained at step S15 is modified by adding the difference impurity profile for each minute calculation region. At step S17, a device characteristic is derived by the device simulation based on the impurity profile obtained at step S16.

In the semiconductor device simulation method according to this embodiment, a difference impurity profile between an initial impurity profile derived based on particular initial process conditions and a modified impurity profile obtained by performing an impurity profile modification starting from the initial impurity profile so that an initial device characteristic is derived corresponding to the initial process conditions as satisfied. Thereafter, desired process conditions are set, and an impurity profile is derived by a process simulation based on the desired process conditions and then corrected by adding the difference impurity profile to it. As a result, incorrectness in an impurity profile derived by a process simulation can easily be eliminated by adding a difference impurity profile to it, and a unified impurity profile for devices having different channel lengths can be derived. Further, in the semiconductor device simulation method according to this embodiment, a device characteristic is derived by a device simulation based on the difference-impurity-profile-added impurity profile. As a result, such manufacturing process conditions as a dose and energy of impurity ion implantation and conditions (time and temperature) of a heat treatment for impurity diffusion after execution of an impurity implantation step can be changed, and then a device characteristic corresponding to resulting manufacturing process conditions can easily be derived. As such, a semiconductor device simulation method having a wide application method is realized.

Embodiment 6

Figure 10:
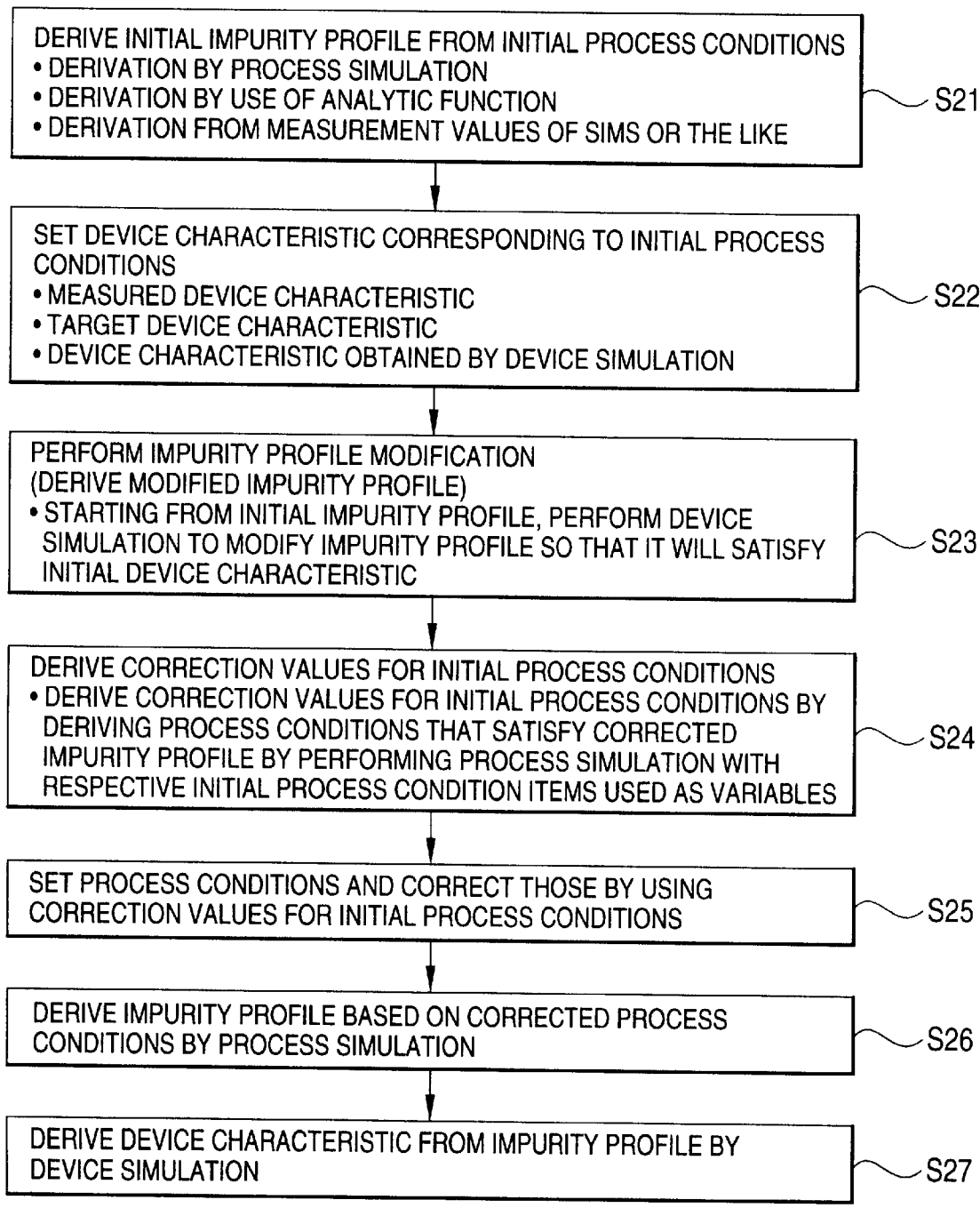
FIG. 10 shows an algorithm of a semiconductor device simulation method according to a sixth embodiment of the invention.

FIG. 10 shows an algorithm of a semiconductor device simulation method according to a sixth embodiment of the invention. First, at step S21, process steps and initial process conditions such as mask conditions that prescribe a device structure are set, and an initial device structure and an initial impurity profile are derived from the initial process conditions by using, for example, one-dimensional, two-dimensional, or three-dimensional shapes and an impurity simulator (i.e. a process simulator). Alternatively, an initial device structure and an initial impurity profile may be derived in a simplified manner by using an analytic function or the like or may be derived by using actual measurement values as a result of an experiment according to a SIMS (secondary ion mass spectroscopy) method or a SR (spreading resistance) method.

At step S22, an initial device characteristic corresponding to the initial process conditions is set. An initial device characteristic may be set in the form of actual measurement values. For example, the initial device characteristic may be Ig–Vd characteristics or Id–Vd characteristics (vg=0.1V, 2V) each of which are current-voltage characteristics with the gate length L being 0.18, 0.25, 0.35, 0.5, 0.75, 1.0, 2.0, 5.0, and 10.0 (m, a Vth–L characteristic that is gate length dependence of the gate threshold voltage, or a C–V characteristic that is gate voltage dependence of the gate capacitance.

An initial device characteristic may be set in other forms than actual measurement values, for example, analytically determined values, target values that are a desired device characteristic of the semiconductor device determined by some other, arbitrary means, or a device characteristic obtained by a circuit simulation or a one-dimensional, two-dimensional, or three-dimensional device simulation. Where an initial device characteristic is derived by using a device simulation, a device simulation that is different from one that will be used at step S23 and S27 is used.

Then, at step S23, starting from the initial impurity profile, a modified impurity profile is derived by performing impurity profile modification (i.e. iterative calculations) by using one-dimensional, two-dimensional, or three-dimensional device simulation or some other algorithm so that the initial device characteristic will be satisfied.

At step S24, correction values for the initial process conditions are derived by deriving process conditions that satisfy the modified impurity profile by a process simulation in which items of the initial process conditions (e.g., a dose and energy of impurity ion implantation, conditions (time and temperature) of a heat treatment for impurity diffusion after execution of an impurity implantation process, and a diffusion coefficient) are used as variables.

At step S25, desired process conditions are set and corrected by using the correction values for the initial process conditions. At step S26, an impurity profile is derived by the process simulation based on the corrected process conditions. At step S27, a device characteristic is derived by a device simulation based on the impurity profile obtained at step S26.

In the semiconductor device simulation method according to the sixth embodiment, a modified impurity profile that satisfies an initial device characteristic corresponding to particular initial process conditions is derived by performing impurity profile modification starting from an initial impurity profile derived based on the initial process conditions. Correction values for the initial process conditions are derived by deriving process conditions that satisfy the modified impurity profile by a process simulation. Thereafter, desired process conditions are set and corrected by using the correction values for the initial process conditions, and then an impurity profile is derived by a process simulation. As a result, incorrectness in an impurity profile derived by a process simulation can easily be eliminated by correcting process conditions, and a unified impurity profile for devices having different channel lengths can be derived. Further, in the semiconductor device simulation method according to this embodiment, a device characteristic is derived by a device simulation based on the impurity profile derived based on the corrected process conditions. As a result, such manufacturing process conditions as a dose and energy of impurity ion implantation and conditions (time and temperature) of a heat treatment for impurity diffusion after execution of an impurity implantation step are changed, and then a device characteristic corresponding to resulting manufacturing process conditions can easily be derived. As such, a semiconductor device simulation method having a wide application method is realized.

The semiconductor device as an object of the simulation according to the invention is not limited to a MOS transistor formed on a silicon substrate and the invention can similarly be applied to semiconductor devices using an SOI (silicon on insulator) substrate, compound semiconductors, and so forth. For those semiconductor devices, the invention provides a highly accurate prediction method using process/device simulations that is applicable to designing and optimization of process conditions and a device structure.

In the fifth and sixth embodiments, in a case where an initial impurity profile is derived based on SIMS data or the like, a device characteristic that would be obtained when such a process condition as a gate oxide film thickness or a gate length is changed can be predicted. Where an initial impurity profile is derived based on an item other than actual measurement values, such as target values that are a desired device characteristic of a semiconductor device, it is set by using values of initial process conditions that are expected in advance to some extent.

Although the invention has been described above by using the embodiments, the invention is not limited to the embodiment and various modifications are possible without departing from the spirit and scope of the invention.

What is claimed is:

1. A semiconductor simulation method comprising the steps of:

determining first and second impurity profiles for the same conditions by an inverse modeling method and a calculating means capable of producing a result faster than the reference acquiring means, respectively;

determining errors between the first impurity profile determined by the reference acquiring means and the second impurity profile determined by the calculating means; and calculating a third impurity profile for another kind of conditions by the calculating means, and calculating a fourth impurity profile by correcting the third impurity profile so as to reflect the errors.

2. A semiconductor simulation method comprising the steps of:

determining first and second values of a physical quantative impurity profile of a prescribed portion for the same conditions by a reverse modeling method and a calculating means capable of producing a result faster than the reference acquiring means, respectively;

determining an error between the first physical quantative impurity profile data value determined by the reference acquiring means and the second physical quantative impurity profile data value determined by the calculating means; and calculating a third value of the physical quantative impurity profile data of the prescribed portion for another kind of conditions by the calculating means, and calculating a fourth value of the physical quantative impurity profile data of the prescribed portion by correcting the third value so as to reflect the error.

3. A semiconductor device simulation method comprising the steps of:

setting initial process conditions;

deriving an initial impurity profile based on initial process conditions;

setting an initial device characteristic corresponding to the initial process conditions;

deriving a modified impurity profile that satisfies the initial device characteristic by performing impurity profile modification starting from the initial impurity profile;

deriving a difference impurity profile by calculating differences between the modified impurity profile and the initial impurity profile;

setting desired process conditions;

deriving an impurity profile by a process simulation based on the desired process conditions; and correcting the impurity profile by adding the difference impurity profile to the impurity profile.

4. The semiconductor device simulation method according to claim 3, further comprising the step of deriving a device characteristic by a device simulation based on the difference-impurity-profile-added impurity profile.

5. The semiconductor device simulation method according to claim 3, wherein the initial impurity profile is derived based on the initial process conditions by the process simulation.

6. The semiconductor device simulation method according to claim 3, wherein the initial impurity profile is derived based on the initial process conditions by using an analytic function.

7. The semiconductor device simulation method according to claim 3, wherein the initial impurity profile is derived based on the initial process conditions by using actual measurement values.

8. The semiconductor device simulation method according to claim 3, wherein the initial device characteristic corresponding to the initial process conditions is set by using actual measurement values.

9. The semiconductor device simulation method according to claim 3, wherein the initial device characteristic corresponding to the initial process conditions is set by using values determined analytically.

10. The semiconductor device simulation method according to claim 3, wherein the initial device characteristic corresponding to the initial process conditions is set by using target values.

11. The semiconductor device simulation method according to claim 3, wherein the initial device characteristic corresponding to the initial process conditions is set by using a device characteristic obtained by a simulation.

12. A semiconductor device simulation method comprising the steps of:

setting initial process conditions;

deriving an initial impurity profile based on the initial process conditions;

setting an initial device characteristic corresponding to the initial process conditions;

deriving a modified impurity profile that satisfies the initial device characteristic by performing impurity profile modification starting from the initial impurity profile;

deriving correction values for the initial process conditions by deriving process conditions that satisfy the modified impurity profile by a process simulation in which items of the initial process conditions are used as variables;

setting desired process conditions;

correcting the desired process conditions by using the correction values for the initial process conditions; and deriving an impurity profile by the process simulation based on the corrected conditions to the desired process conditions.

13. The semiconductor device simulation method according to claim 12, further comprising the step of deriving a device characteristic by a device simulation based on the corrected conditions to the desired impurity profile.

14. The semiconductor device simulation method according to claim 12, wherein the initial impurity profile is derived based on the initial process conditions by the process simulation.

15. The semiconductor device simulation method according to claim 12, wherein the initial impurity profile is derived based on the initial process conditions by using an analytic function.

16. The semiconductor device simulation method according to claim 12, wherein the initial impurity profile is derived based on the initial process conditions by using actual measurement values.

17. The semiconductor device simulation method according to claim 12, wherein the initial device characteristic corresponding to the initial process conditions is set by using actual measurement values.

18. The semiconductor device simulation method according to claim 12, wherein the initial device characteristic corresponding to the initial process conditions is set by using values determined analytically.

19. The semiconductor device simulation method according to claim 12, wherein the initial device characteristic corresponding to the initial process conditions is set by using target values.

20. The semiconductor device simulation method according to claim 12, wherein the initial device characteristic corresponding to the initial process conditions is set by using a device characteristic obtained by a simulation.

* * * * *